(12) United States Patent
Guo et al.

(10) Patent No.: US 12,107,053 B2
(45) Date of Patent: Oct. 1, 2024

(54) SHIELDING PROCESS FOR SIP PACKAGING

(71) Applicant: Weifang Goertek Microelectronics Co., Ltd., Shandong (CN)

(72) Inventors: Juncheng Guo, Shandong (CN); Dewen Tian, Shandong (CN); Qinglin Song, Shandong (CN)

(73) Assignee: Weifang Goertek Microelectronics Co., Ltd., Shandong (CN)

( * ) Notice: Subject to any disclaimer, the term of this patent is extended or adjusted under 35 U.S.C. 154(b) by 360 days.

(21) Appl. No.: 17/620,288

(22) PCT Filed: Dec. 6, 2019

(86) PCT No.: PCT/CN2019/123552
§ 371 (c)(1),
(2) Date: Dec. 17, 2021

(87) PCT Pub. No.: WO2020/253147
PCT Pub. Date: Dec. 24, 2020

(65) Prior Publication Data
US 2022/0254731 A1    Aug. 11, 2022

(30) Foreign Application Priority Data
Jun. 17, 2019   (CN) .......................... 201910523418.3

(51) Int. Cl.
H05K 1/02      (2006.01)
H01L 23/552    (2006.01)
H05K 3/28      (2006.01)

(52) U.S. Cl.
CPC ......... H01L 23/552 (2013.01); H05K 1/0218 (2013.01); H05K 3/284 (2013.01)

(58) Field of Classification Search
CPC .............................. H05K 1/0218; H05K 3/284
See application file for complete search history.

(56) References Cited

U.S. PATENT DOCUMENTS 10,256,149 B2 *   4/2019   Zechmann ............ H01L 23/544
2018/0323128 A1*  11/2018  Dias .................... H01L 23/3128

FOREIGN PATENT DOCUMENTS

| CN | 102074552 A |   | 5/2011  |              |
|----|-------------|---|---------|--------------|
| CN | 102194797 A |   | 9/2011  |              |
| CN | 103681625 A | * | 3/2014  | H01L 23/3107 |
| CN | 109390324 A |   | 2/2019  |              |
| CN | 110335862 A |   | 10/2019 |              |

* cited by examiner

*Primary Examiner* — Binh X Tran
(74) *Attorney, Agent, or Firm* — Baker Botts LLP

(57) ABSTRACT

Disclosed is a shielding process for SIP packaging, including: providing a circuit board; cutting the covering layer to form half-cut trenches separating different SIP packaging modules from each other, and to form grooves in each single SIP packaging module; forming a metal overlay, the metal overlay on an outer surface of the SIP packaging module and at positions where the half-cut trenches are located constituting a conformal shielding, the metal overlay at positions where the grooves are located constituting a compartment shielding; and cutting the half-cut trenches to obtain a plurality of SIP packaging modules that are separate from each other.

10 Claims, 2 Drawing Sheets

SHIELDING PROCESS FOR SIP PACKAGING

CROSS-REFERENCE TO RELATED APPLICATIONS

This application is a National Stage of International Application No. PCT/CN2019/123552, filed on Dec. 6, 2019, which claims priority to Chinese Patent Application No. 201910523418.3, filed on Jun. 17, 2019, both of which are hereby incorporated by reference in its entirety.

TECHNICAL FIELD

The present disclosure relates to the field of chip packaging, and particularly, relates to a process for forming electromagnetic shielding in SIP packaging.

BACKGROUND

SIP (System In a Package) packaging integrates a variety of functional chips (including processor, memory and other functional chips) into a package to realize a substantially complete function. It corresponds to SOC (System On Chip), but the difference between them is that SIP packaging is a packaging method in which different chips are arranged side by side or stacked, while SOC is a highly integrated chip product.

A packaging technology for SIP is necessary for the development of electronic products towards miniaturization and thinning. In products related to wireless communication, storage, power supply, etc., in order to prevent a packaged module from experiencing external interference or mutual interference between chips in the module, electromagnetic shielding design is necessary. The shielding design of a traditional SIP packaging usually includes two technologies: conformal shielding and compartment shielding. Moreover, these two shielding methods have to be performed separately due to different structures and different positions.

For example, when performing the compartment shielding, it is necessary to make grooves on a single package and then fill the grooves with highly conductive silver paste, so as to form compartment shielding of SIP packaging and thus avoid mutual interference between different chips in SIP packaging. When performing the conformal shielding, it is necessary to cut out a single SIP packaging module and form conductive silver paste on an exposed external surface of the module through a process such as sputtering, so as to form the conformal shielding of SIP packaging and thus prevent the SIP packaging module from external electromagnetic interference.

The above conformal shielding and compartment shielding need to be completed separately. What is more, holes tend to occur when the conductive silver paste is filled into the groove due to high viscosity of the conductive silver paste, which leads to an increase in resistance; in addition, burrs tend to occur when covering a single surface with a metal overlay.

SUMMARY

An object of the present disclosure is to provide a new technical solution for a shielding process for SIP packaging.

According to a first aspect of the disclosure, a shielding process for SIP packaging is provided, and comprises the following steps:

providing a circuit board with a plurality of SIP packaging modules arranged thereon, the plurality of SIP packaging modules being packaged by the same covering layer;

cutting the covering layer to form half-cut trenches separating different SIP packaging modules from each other, and to form grooves in each single SIP packaging module;

forming a metal overlay on an exposed surface of the SIP packaging module; the metal overlay on an outer surface of the SIP packaging module and at positions where the half-cut trenches is located constitutes a conformal shielding; the metal overlay at positions where the grooves are located constitutes a compartment shielding;

cutting the half-cut trenches to obtain a plurality of SIP packaging modules that are separate from each other.

Optionally, the circuit board is provided with a earth wire thereon, and at least part of the earth wire is exposed on a surface of the circuit board; the covering layer is cut to the surface of the circuit board so as to expose the earth wire on the surface of the circuit board; after forming the metal overlay on the exposed surface of the SIP packaging module, the metal overlay in the half-cut trenches and the grooves contact with and conduct with the earth wire.

Optionally, the circuit board is provided with a earth wire thereon, and at least part of the earth wire is in the circuit board; the half-cut trenches and the grooves formed by cutting extend into the circuit board until the earth wire in the circuit board is exposed; after forming the metal overlay on the exposed surface of the SIP packaging module, the metal overlay in the half-cut trenches and the grooves contact with and conduct with the earth wire.

Optionally, the half-cut trenches and/or the grooves are formed by laser.

Optionally, the metal overlay is formed by electroplating, dispensing or spraying.

Optionally, at the grooves of the SIP packaging module, the compartment shielding has a gap at its center; the gap is filled with a reinforcing material.

Optionally, the reinforcing material is made of the same material as that of the covering layer.

Optionally, the reinforcing material is silicon dioxide.

Optionally, the reinforcing material is filled into the gap through dispensing or printing.

Optionally, the half-cut trenches are cut by laser so as to obtain the plurality of SIP packaging modules that are separate from each other.

According to an embodiment of the present disclosure, the conformal shielding and the compartment shielding may be formed at the same time, completed in the same procedure, and made of the same material. With the shielding process of the present disclosure, it is possible to manufacture continuously and in large quantities, improve the manufacturing efficiency, reduce the cost of production, and reduce the burrs.

Other features and advantages of the present disclosure will become apparent from the following detailed description of exemplary embodiments of the present disclosure with reference to the accompanying drawings.

BRIEF DESCRIPTION OF THE DRAWINGS

The accompanying drawings, which are incorporated in the description and constitute a part of the description, illustrate embodiments of the present disclosure, and together with the description thereof, serve to explain the principles of the present disclosure.

DETAILED DESCRIPTION

Figure 1:
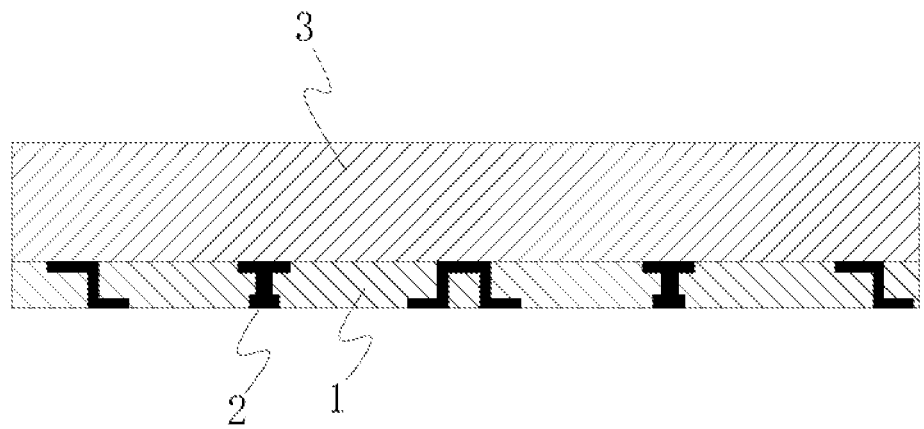
FIGS. 1-5 are flowcharts of the shielding process of the present disclosure.

Various exemplary embodiments of the present disclosure will now be described in detail with reference to the accompanying drawings. It should be noted that the relative arrangement, numerical expressions and numerical values of the components and steps set forth in these examples do not limit the scope of the disclosure unless otherwise specified.

The following description of at least one exemplary embodiment is in fact merely illustrative and is in no way intended as a limitation to the present disclosure and its application or use.

Techniques, methods, and apparatus known to those of ordinary skill in the relevant art may not be discussed in detail but where appropriate, the techniques, methods, and apparatus should be considered as part of the description.

Among all the examples shown and discussed herein, any specific value should be construed as merely illustrative and not as a limitation. Thus, other examples of exemplary embodiments may have different values.

It should be noted that similar reference numerals and letters denote similar items in the accompanying drawings, and therefore, once an item is defined in a drawing, and there is no need for further discussion in the subsequent accompanying drawings.

The present disclosure provides a shielding process for SIP packaging, and a SIP packaging module obtained by the process has a conformal shielding and a compartment shielding. Since the conformal shielding and the compartment shielding are formed at the same time, it is possible to improve the efficiency of the shielding process. In addition, the shielding process does not need to process an individual SIP packaging module, so it is possible to achieve large-scale mass production and avoid the burrs that are easily generated by the shielding process of a single SIP packaging module.

The SIP packaging module of the present disclosure may be a well-known SIP packaging in the field of electronic products, for example, the packaging of communication chips such as WiFi and Bluetooth, which will not be listed herein.

FIGS. 1-5 show flow diagrams of the shielding process of the present disclosure.

Referring to FIG. 1, a circuit board 1 is provided, and a plurality of SIP packaging modules (not shown in FIG. 1) are arranged on the circuit board 1. In large-scale mass production, a plurality of functional chips constituting a single SIP packaging module can be arranged on the circuit board 1 in batches through a process well known to those skilled in the art, and each SIP packaging module is arranged on the same circuit board 1 in a modular manner.

When the arrangement of the chips is completed, a covering layer 3 encapsulates the chips on the circuit board 1. The covering layer 3 may adopt a material and a process well known to those skilled in the art to encapsulate the arranged chips on the circuit board 1, including but not limited to polymer materials such as injection plastic or silicon materials such as silicon dioxide.

Figure 2:
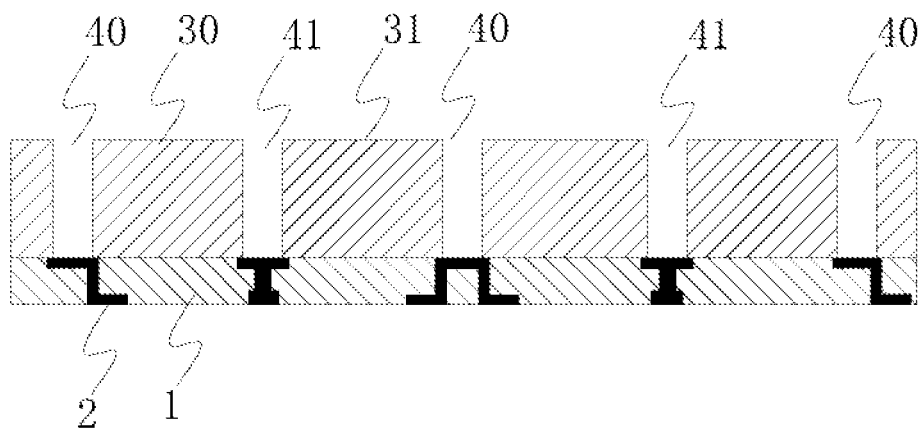

Referring to FIG. 2, the covering layer 3 is cut to form half-cut trenches 40 separating different SIP packaging modules from each other, and to form grooves 41 formed in each single SIP packaging module.

FIG. 2 shows a schematic diagram of the distribution of two SIP packaging modules on the circuit board 1. Of course, for those skilled in the art, more SIP packaging modules may be on the circuit board 1, and for example, are arranged in a matrix array, which will not be described in detail herein.

The half-cut trenches 40 formed by cutting the covering layer 3 separate the two SIP packaging modules from each other and expose the periphery of each SIP packaging module. The shapes of the half-cut trenches 40 match the shape of each SIP packaging module. If the outer contour of the SIP packaging module is cylindrical, the half-cut trenches 40 constitute an annular groove to expose the outer contour (side wall) of the SIP packaging module.

The grooves 41 formed by cutting the covering layer 3 separate the different chips from each that need to be shielded in each SIP packaging module. For example, when the SIP packaging module includes a WiFi chip and a Bluetooth chip, the grooves 41 separates the WiFi chip from the Bluetooth chip. The shape and number of the grooves 41 are related to the shape and number of chips to be shielded in the SIP packaging module, which will not be described in detail herein.

In the embodiment shown in FIG. 2, grooves 41 on the covering layer 3 separate a single SIP packaging module into a first package 30 and a second package 31. The first package 30 and the second package 31 are respectively provided with chips that need to be electromagnetically shielded from each other. For example, the Bluetooth chip is packaged in the first package 30, and the Wi-Fi chip is packaged in the second package 31.

In this step, grooves 41 may be formed by laser. The half-cut trenches 40 may be cut in a manner well known to those skilled in the art. Of course, the half-cut trenches 40 may also be formed by laser in the same procedure or in a different procedure together with the grooves 41. It is possible to reduce the burrs by laser, so as to facilitate the uniformity and smoothness of the subsequent metal overlay.

Figure 3:
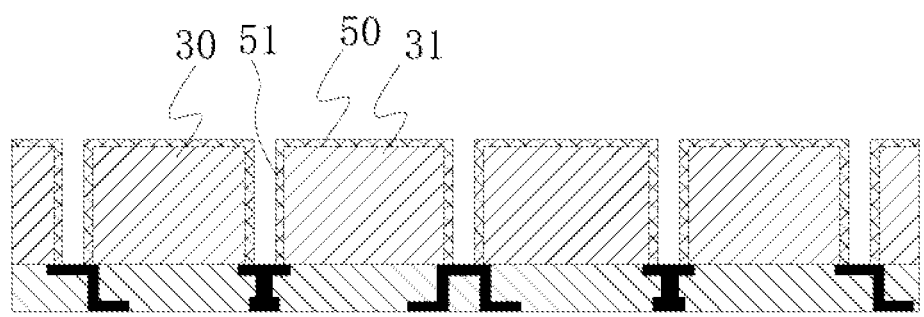

Referring to FIG. 3, the metal overlay is formed on the exposed surfaces of the SIP packaging module. For example, the metal overlay may be formed on the exposed surfaces of the SIP packaging module through a process such as electroplating, dispensing or spraying. The metal overlay covers the top surface of the SIP packaging module, as well as the sidewalls of the SIP packaging module where the grooves 41 and the half-cut trenches 40 are located.

Herein, the metal overlay on the external surface of the SIP packaging module and the position where the half-cut trenches 40 are located constitute a conformal shielding 50; the metal overlay on the position where the grooves 41 are located constitutes a compartment shielding 51 of the single SIP packaging module.

Specifically, since the half-cut trenches 40 are provided around the single SIP packaging module, the metal overlay on the sidewall of the SIP packaging module and a surface of the SIP packaging module at a side away from the circuit board 1 may constitute the conformal shielding 50 of the SIP packaging module.

The grooves 41 separate the single SIP packaging module into the first package 30 and the second package 31, and when the metal overlay is formed into the grooves 41, the metal overlay may electromagnetically shield chips in the first package 30 and the second package 31, so as to constitute the compartment shielding 51 of the SIP packaging module. In this embodiment, the metal overlay may be formed on the sidewall of the first package 30 and the sidewall of the second package 31 respectively, or may be filled into the entirety of the grooves 41.

When the metal overlay is formed by a process such as electroplating, dispensing or spraying, in order to make the metal overlay cover the sidewalls at the positions where the grooves 41 and the half-cut trenches 40 are located, it is necessary to choose aspect ratios of the grooves 41 and the half-cut trenches 40 reasonably. For those skilled in the art, wider and shallower grooves 41 and half-cut trenches 40 are more conducive to formation of the metal overlay; and of course, it is also related to the process of the metal overlay, which will not be described in detail herein.

For those skilled in the art, the prerequisite for forming an electronic shield is to ground the formed metal overlay. For example, after forming the metal overlay, the metal overlay may be grounded through a process such as a wire.

In the process of the present disclosure, earth wires 2 are provided on the circuit board 1, and at least a part of the earth wires 2 is exposed on the surface of the circuit board 1, as shown in FIG. 1. The covering layer 3 is cut to the surface of the circuit board 1, so that the grooves 41 and the half-cut trenches 40 formed by cutting expose the earth wires 2 corresponding to their respective positions, as shown in FIG. 2. After forming the metal overlay, the metal overlay at the positions where the grooves 41 and the half-cut trenches 40 are located contact with and conduct with the earth wires 2.

In another embodiment of the present disclosure, at least part of the earth wires 2 is located inside the circuit board 1. In this case, it is necessary to cut the covering layer 3 and a part of the circuit board 1 so that the formed half-cut trenches 40 and grooves 41 can extend into the circuit board 1 and expose the earth wires 2 located in the circuit board 1, which facilitates the metal overlay subsequently formed in the half-cut trenches 40 and the grooves 41 to be in contact with the earth wires 2 and thus realizes the conduction between the metal overlay and the earth wires 2.

In an optional embodiment of the present disclosure, at the position of the grooves 41 of the SIP packaging module, the compartment shielding 51 has a gap at its center where a reinforcing material 6 is filled.

Referring to FIG. 3, the aspect ratio of the grooves 41 and the process of the overlay are chosen such that the metal overlay does not fill the entire grooves 41, but is only located on the sidewall where the grooves 41 are located, that is, only formed on the sidewalls of the first package 30 and the second package 31. A gap is formed between the metal overlay on the sidewall of the first package 30 and the metal overlay on the sidewall of the second package 31.

Figure 4:
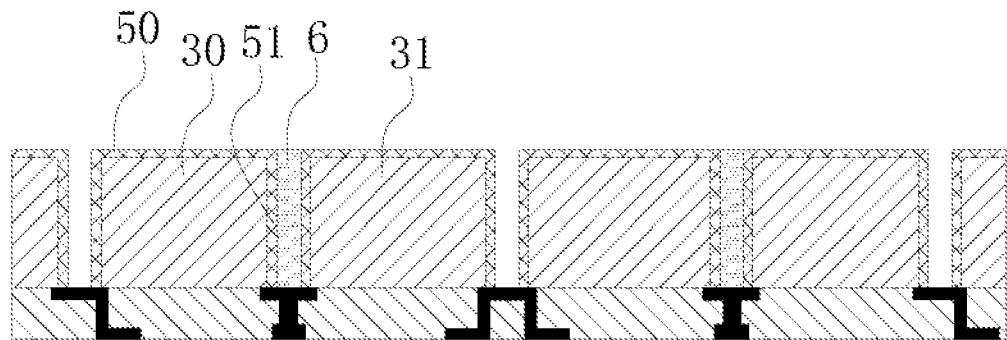

Through a process well-known to those skilled in the art such as glue or printing, the reinforcing material 6 can be filled in the gap to improve the structural strength of the SIP packaging module and avoid the problem of low structural strength caused by cutting the grooves 41, as shown in FIG. 4. At the same time, the metal overlay only covers the sidewalls of the first package 30 and the second package 31, so as to avoid bubbles caused by filling the traditional conductive silver paste.

The reinforcing material 6 is preferably made of the same material as that of the covering layer 3. In this way, it is possible to avoid problems such as low reliability of a product caused by the difference in stress and expansion coefficient. For example, in a specific embodiment of the present disclosure, both the reinforcing material 6 and the covering layer 3 are of silicon dioxide material.

Figure 5:
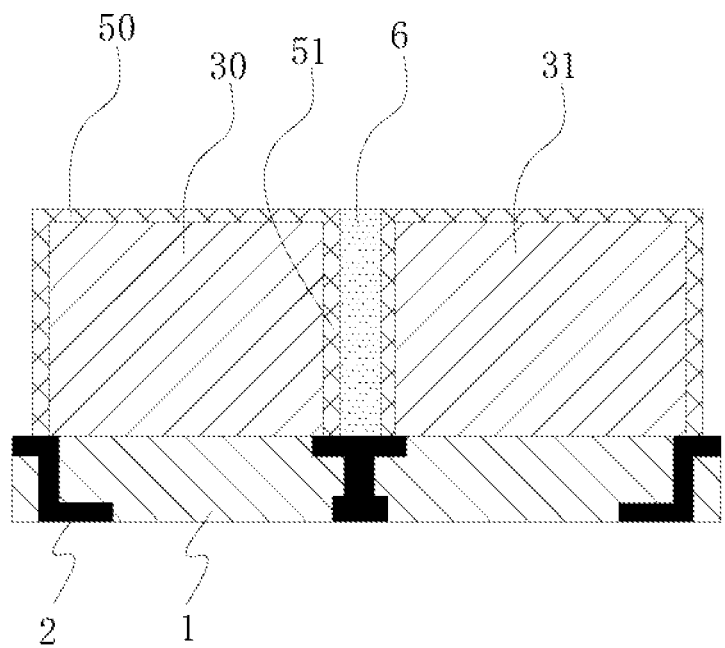

Finally, the half-cut trenches 40 is cut to obtain a plurality of separate SIP packaging modules, as shown in FIG. 5. For example, it is possible to cut along the half-cut trenches 40 by laser to obtain a plurality of separate SIP packaging modules. Cutting by laser can avoid burrs of a product.

Specifically, during operation, the circuit board 1 can be positioned downward and the covering layer 3 can be positioned upward, or the circuit board 1 can be positioned upward and the covering layer 3 can be positioned downward, so as to prevent deviation during cutting by laser.

With the shielding process of the present disclosure, the conformal shielding and the compartment shielding may be formed at the same time, completed in the same procedure, and made of the same material. With the shielding process of the present disclosure, it is possible to manufacture continuously and in large quantities, improve the manufacturing efficiency, reduce the cost of production, and reduce the burrs.

While certain specific embodiments of the present disclosure have been illustrated by way of example, those skilled in the art shall understand that the foregoing examples are provided for the purpose of illustration and are not intended to limit the scope of the present disclosure. Those skilled in the art shall understand that the foregoing embodiments may be modified without departing from the scope and spirit of the disclosure. The scope of the present disclosure is subject to the attached claims.

The invention claimed is:

1. A shielding process for SIP packaging, comprising:
   providing a circuit board with a plurality of SIP packaging modules arranged thereon, the plurality of SIP packaging modules being packaged by a common covering layer;
   cutting the covering layer to form half-cut trenches separating each of the plurality of SIP packaging modules from each other, and to form grooves in each of the plurality of SIP packaging modules, wherein each of the half-cut trenches separates two SIP packaging modules from each other, and each of the grooves separates each of a plurality of chips to be shielded in each of the SIP packaging module;
   forming a metal overlay on an exposed surface of the SIP packaging module to form a conformal shielding and a compartment shielding at the same time, the metal overlay formed on an outer surface of the SIP packaging module and at positions where the half-cut trenches are located thereby constitutes the conformal shielding to prevent the SIP packaging module from external electromagnetic interference, and the metal overlay at positions where the grooves are located thereby constitutes the compartment shielding to avoid mutual interference between the plurality of chips in each of the SIP packaging; and
   cutting the half-cut trenches to obtain a plurality of separated SIP packaging modules.

2. The shielding process of claim 1 for SIP packaging, wherein
   the circuit board is provided with an earth wire thereon, at least part of the earth wire being exposed on a surface of the circuit board;
   the covering layer is cut to the surface of the circuit board to expose the earth wire on the surface of the circuit board; and
   the forming the metal overlay comprises forming the metal overlay in the half-cut trenches and the grooves to contact with and conduct with the earth wire.

3. The shielding process of claim 1 for SIP packaging, wherein
   the circuit board is provided with an earth wire thereon, and at least part of the earth wire is in the circuit board;

wherein the half-cut trenches and the grooves formed by cutting extend into the circuit board until the earth wire in the circuit board is exposed; and the forming the metal overlay comprises forming the metal overlay in the half-cut trenches and the grooves to contact with and conduct with the earth wire.

4. The shielding process of claim 1 for SIP packaging, wherein
the cutting the covering layer comprises using a laser to form the half-cut trenches and/or the grooves.

5. The shielding process of claim 1 for SIP packaging, wherein
the forming the metal overlay is selected from the group consisting of electroplating, dispensing and spraying.

6. The shielding process of claim 1 for SIP packaging, wherein
the cutting the half-cut trenches comprises using a laser to obtain the plurality of separated SIP packaging modules.

7. The shielding process of claim 1 for SIP packaging, wherein
at the grooves of the SIP packaging module, the compartment shielding has a gap at its center; further comprising filling the gap with a reinforcing material.

8. The shielding process of claim 7 for SIP packaging, wherein
the covering layer comprises a material, and the reinforcing material comprises the material.

9. The shielding process of claim 7 for SIP packaging, wherein
the reinforcing material is silicon dioxide.

10. The shielding process of claim 7 for SIP packaging, wherein
the filling is selected from the group consisting of dispensing and printing.

* * * * *